MODULE ASSEMBLY

Filed Oct. 21, 1963 3 Sheets-Sheet 1

INVENTORS:
MICHAEL LAZAR
ROCCO J. NOSCHESE
CHARLES A. GOURLEY
BY Howard S Reiter
ATTORNEY INVENTORS:
MICHAEL LAZAR
ROCCO J. NOSCHESE
CHARLES A. GOURLEY
BY Howard S Reuter
ATTORNEY INVENTORS:
MICHAEL LAZAR
ROCCO J. NOSCHESE
CHARLES A. GOURLEY
BY Howard S. Reiter
ATTORNEY 3,265,936

MODULE ASSEMBLY

Michael Lazar, White Plains, N.Y., and Rocco J. Noschese, Rowayton, and Charles A. Gourley, Bethel, Conn., assignors to Burndy Corporation, a corporation of New York Filed Oct. 21, 1963, Ser. No. 317,657

12 Claims. (Cl. 317—101)

This invention pertains generally to the electrical interconnection of printed circuit boards and electronic equipment, and more particularly to assemblies of interconnected circuit boards in which connection means and circuit boards are combined in a composite structure adapted to be utilized as an integral circuit module.

Composite assemblies of printed circuit boards, or of similar preformed circuit devices having attached circuit components, are an outgrowth of the trend toward miniaturization and improved space utilization in electronic apparatus. The assemblies known and used at present commonly comprise a multiple-layer array of circuit boards supported in parallel, spaced apart relationship. In some, the boards are connected to related equipment and to each other through riser bus wires extending between layers, perpendicular to the plane of the boards. Alternatively, it is known to provide a plurality of individual, edge-type connectors which are mechanically supported in parallel, spaced apart relation, for engaging the required plurality of boards.

Accordingly, it is an object of this invention to provide an improved connector assembly of circuit boards and interconnection means.

A concurrent objective is to provide such an assembly which may be simply and quickly assembled as a unit for connection to the circuitry of a given apparatus.

Similarly, another object is to provide an improved arrangement for supporting and interconnecting a plurality of printed circuit boards in a three-dimensional array.

Still another object is the provision of a modular connector assembly of printed circuit boards which occupies a minimum volume.

Other objectives of this invention include providing an assembly of the type described, in which: the component boards are individually supported to facilitate handling for assembly, removal and maintenance; the boards are positioned in a manner adapted to facilitate desirable heat dissipation in the assembled components; interconnections between components of the assembly may be readily varied without requiring disassembly; possible electrical connections include individual terminal connections to external conductors, individual interconnections between assembly components, and bus-type multiple connections to common points.

The specific embodiment of this invention herein illustrated includes a central spindle member having means for supporting a plurality of printed circuit boards in nonparallel planes peripherally disposed about the spindle, and a pair of housing devices each having a plurality of nonparallel board receiving slots, which include means to mechanically and electrically engage the ends of the supported boards, at opposite ends of the spindle. The electrical engaging means in each housing permit intra and interconnections, as well as individual input and output connections, for each board.

One feature of this invention may thus be seen to lie in the mounting of a plurality of circuit or component boards, comprising a module assembly, in nonparallel planes disposed about a central axis.

A related feature lies in supporting the plurality of boards in such manner by means of a pair of spaced apart, axially interconnected housings.

Another related feature includes the use, in such assembly, of a central spindle member for mechanically supporting a plurality of circuit boards, and separate connector means for electrically engaging the conductors on the boards.

A centrally positioned subassembly having peripherally disposed removable contact fingers for engaging conductive surfaces on the peripherally disposed boards, to form bus-type common interconnections, comprises another feature of this invention.

These and other objects, features and advantages of this invention will be made more apparent by the following specification and claims, taken in conjunction with the following drawings, in which:

Figure 1:
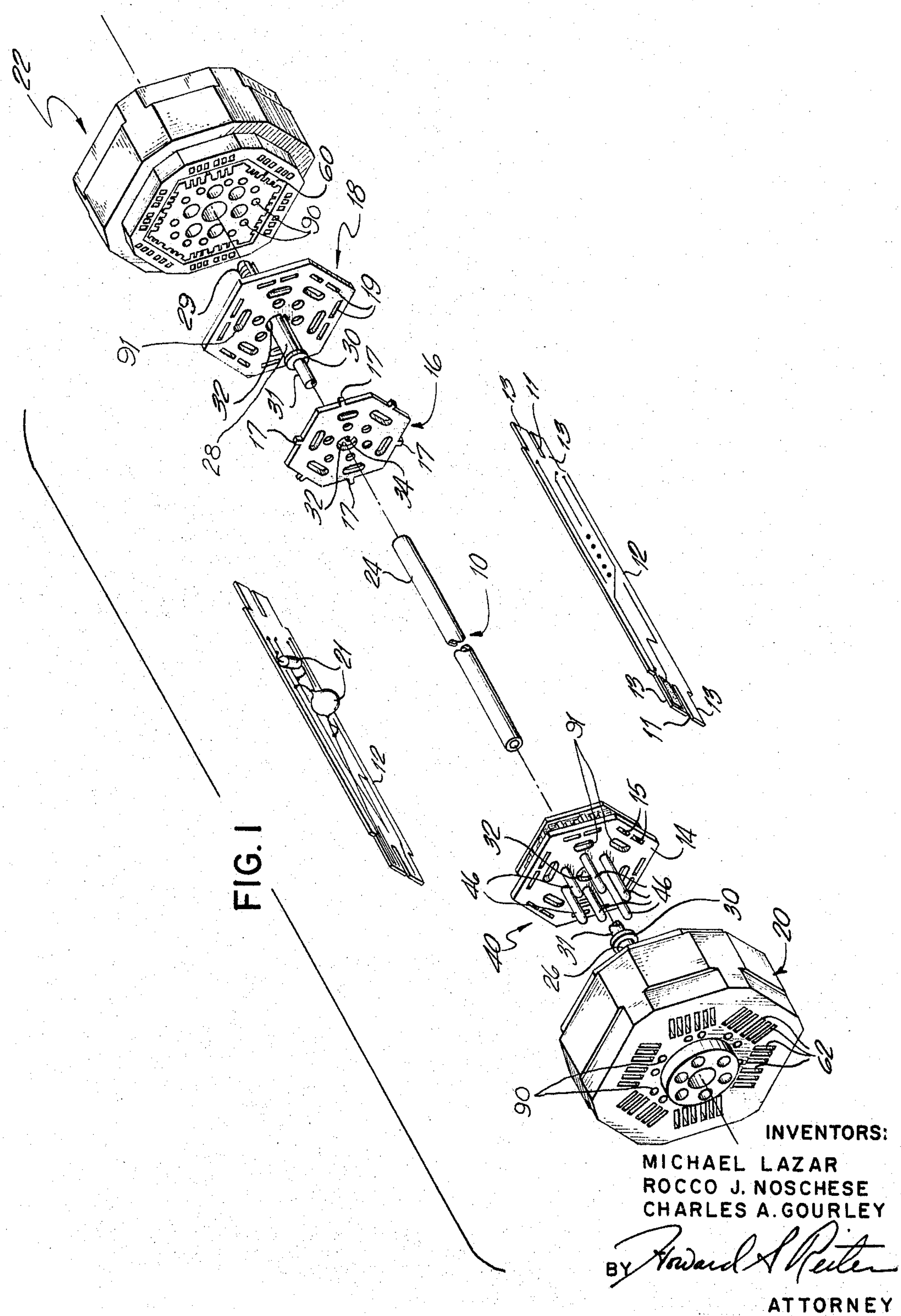
FIGURE 1 is a partially exploded pictorial representation of the connector assembly module herein described.

Referring now more particularly to FIGURE 1, the module assembly of this embodiment of the present invention may be seen to comprise a central spindle or support axle 10, a plurality of elongate printed circuit boards 12, a pair of axially spaced apart circuit board support devices 14 and 16 coaxial with the spindle 10, a separate locking and support member 18 which locks the boards 12 to support 16 in a manner to be described below, and a pair of circuit board receptacle caps or housing members 20 and 22, disposed at opposite ends of the spindle 10.

The boards 12, which may be of any standard construction, typically having conductors and components mounted on a flat base sheet of dielectric material, are disposed peripherally about the spindle 10 in a plurality of nonparallel planes corresponding generally to the sides of a polyhedral geometric shape. Although the illustrated embodiment accommodates six boards (only two of which are shown in FIGURE 1) on the hexagonal supports and connectors, it is clear that any reasonable number of boards may be designed into a module constructed in accordance with the principles of this invention, and that within these principles the shape described by the boards may include one or more open sides in addition to the illustrated open ends.

Figures 2, 3:
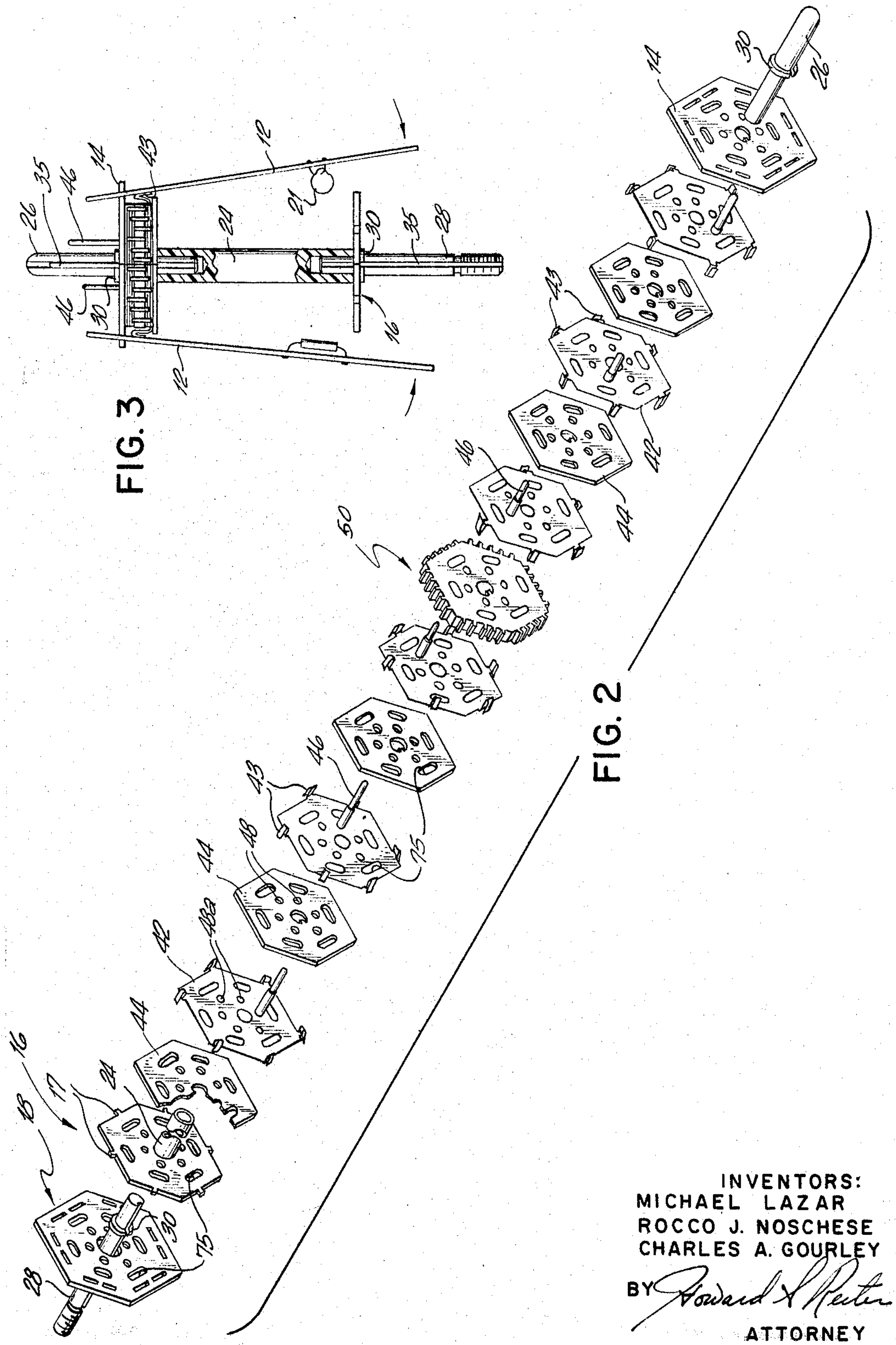
FIGURE 2 is an axially exploded view of the power distribution wafer subassembly 40 which is shown fully assembled in FIGURE 1.
FIGURE 3 is a partially assembled side view of the skeleton of the assembly with the endmost connector housing members removed.

Each board is formed to include a pair of mounting tabs 13, which form between them a slot 11, at both ends. The tabs 13 at one end of each board are received by a pair of corresponding slots 15 in support wafer 14, to capture the end of the board laterally to the wafer while permitting hingelike relative motion. In use, while one end of the board engages wafer 14 as described, slot 11 at the other end is free to engage one of the peripheral radial projections 17 on support wafer 16 in a snap-in or force-fit relation. As illustrated in FIGURE 3, the boards 12 may thus be secured between supports 14 and 16 in substantially fixed relation to spindle 10. Alternatively, they may be supported solely by slots 15 in diverging conical (i.e. "rose petal") relationship, to facilitate inspection and servicing of the inner faces of the boards both during and after assembly.

The basic skeleton of the module, that is, the assembly comprising boards 12, spindle 10, and supports 14 and 16 is completed prior to engagement of caps 20 and 22 by closing the open end of the "rose petal," snapping the slot 11 of each board onto the corresponding tab 17, and then fitting locking wafer 18 over the ends of the boards, on top of wafer 16, to engage the tabs 13 in locking slots 19. Support 16 thus may be seen to serve effectively as a positioning device for facilitating assembly of locking wafer 18 and for permitting inspection of individual boards on the skeleton when wafer 18 is removed.

To facilitate the mounting and axial spacing of wafers 14, 16 and 18 on the spindle 10, the spindle in this embodiment is formed of a central tubular or bored-out element 24, and separate end pieces 26 and 28. Each piece includes a flange 30 and a reduced diameter portion 31, below the flange, which is adapted to be inserted into one end of the bore in central tube 24. Each of wafers 14 and 16 in turn include a central aperture 32 adapted to fit over one of the reduced diameter portions 31 and to engage one of the flanges 30. The two wafers may thus be mounted in fixed axial position on the spindle 10 by inserting the end piece portion 31 through the aperture 32, and into the bore of central portion 24, to capture the wafer between flange 30 and the end of portion 24. Portion 31 may be force fitted or otherwise secured by any convenient means, within tube 24. To prevent relative rotation of the two wafers when they have been secured as described, each is provided with a key projection 34 adapted to mate with a longitudinal keyway 35 (shown most clearly in FIGURE 3) on each of end pieces 26 and 28. Locking wafer 18 may similarly be provided with a key 34 to assure proper alignment with wafer 16.

The power wafer subassembly 40, shown fully assembled in FIG. 1 and in exploded view in FIGURE 2, comprises a stacked assembly of conductive wafers 42 alternated with insulating wafers 44. Each conductive wafer includes a plurality of peripherally disposed springy contact fingers 43 which engage conductor surfaces on the abutting circuit boards to provide bus-type multiple interconnections between the conductors of various boards. A pin contact 46 is mechanically and electrically secured to each of wafers 42 to provide for electrical connections between the wafers and external conductors, as will be described below. In this embodiment, positioning wafer 14 is included as part of the subassembly 40, thereby making the entire subassembly part of the basic module skeleton. The stacked wafers of the subassembly, each of which includes a central aperture 32, are axially secured between portion 24 and flange 30 of end piece 26 as previously described.

Each conductive wafer 42 includes a single contact finger 43 on each of its outer edges; the fingers preferably being made removable, as by bending and breaking for example, to facilitate selective contact with less than all of the circuit boards in the module. The contact fingers on successive wafers are staggered transversely along each edge, as may be seen in FIGURES 1 and 2, so as to form a side-by-side spaced apart array of contacts on each face of the assembled stack. An insulating spacing wafer 50 of slightly increased thickness forms the middle layer of the stack and helps reduce the axial height thereof by permitting reversal of the axial direction of half the contact fingers. The previously described "rose petal" effect achieved by the hinge-action engagement of the boards 12 with wafer 14 also serves to lever the surface of the boards inwardly against the fingers as the petal is closed, to assure effective contact pressure.

As previously noted, each conductive wafer 42 also includes a perpendicularly extending contact pin 46 adapted to extend through aligned passage holes 48 and 48' in the intervening insulating and conductive wafers respectively, and to project from the base of the assembled stack as shown in FIGURE 1. One or more of the projecting pin contacts may be made substantially longer than the others in the assembly to assure completion of the circuit through that contact prior to engagement of the others with their mating contacts; this feature is often desirable, for example, in circuits subject to damage from the application of high potential to ungrounded components. The pins, which emerge from the stack in generally parallel spaced apart relation, may be engaged by mating socket contacts (not shown) disposed in bores 70 in cap 20, to complete electrical connections to the wafers as the cap is assembled to the module skeleton.

Cap or receptacle member 22 which may be called the programming connector cap, and receptacle member 20, which may be called the terminal connector cap, may both be formed of substantially identical dielectric parts, although each serves a different purpose. That is, each may be provided with all of the features required for service as either cap 20 or 22, with the features not required in the selected position merely remaining unused. Thus, both caps may include: a central bore 32 having a key 34 for receiving and engaging either of end pieces 26 or 28 on spindle 10, a plurality of nonparallel slots 60 arranged in substantially polygonal form for receiving the ends of the circuit boards of the module skeleton, and a plurality of contact receiving bores 70 adapted to receive mating contacts (not shown) for engaging pin contacts 46.

Figure 4:
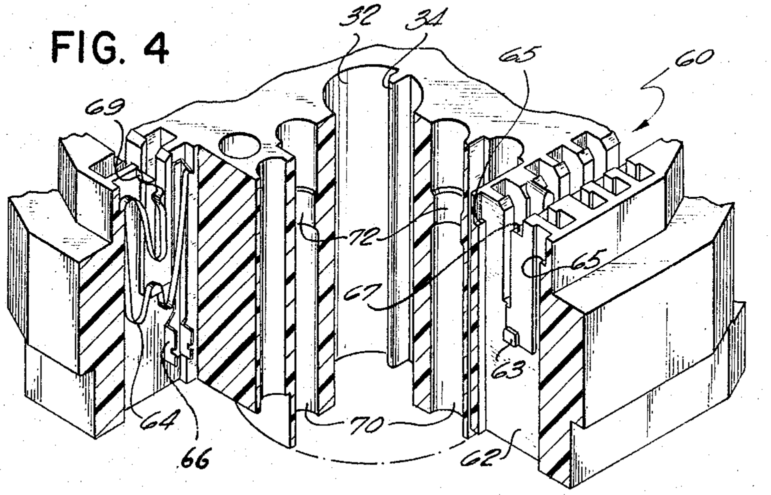
FIGURE 4 is a partial, cut away pictorial view of one of the connector housing members.

Elongate circuit board receiving slots 60 may each include a plurality of transverse slots 62 and a plurality of resilient contact members 64 (such as are described, for example, in copending application Serial No. 151,237, which is assigned to the assignee of this application) disposed in the slots for electrically engaging the printed circuit boards of the module skeleton. Terminal or "read out" contacts 66, secured at one end to external conductors 72 which are, in turn, connected to external circuitry, are inserted into slots 62 to complete electrical connections through circuit board contacts 64 to the circuit boards in the module. As may be seen in FIGURES 1 and 4, the transverse slots 62 extend through caps 20 and 22, opening in both the front and rear faces thereof, and a stop 63 extends across the interior of each slot to provide a seat for positioning contacts 64 therein. Contacts 64 are inserted through the front face of the receptacles and may thereafter be locked in by the means described below. Terminal contacts 66, which are inserted through the rear of the caps, may be provided with detent means (not shown) which cooperate with detent shoulders 65 within slots 62 to retain the contacts therein after insertion.

Figures 5, 6:
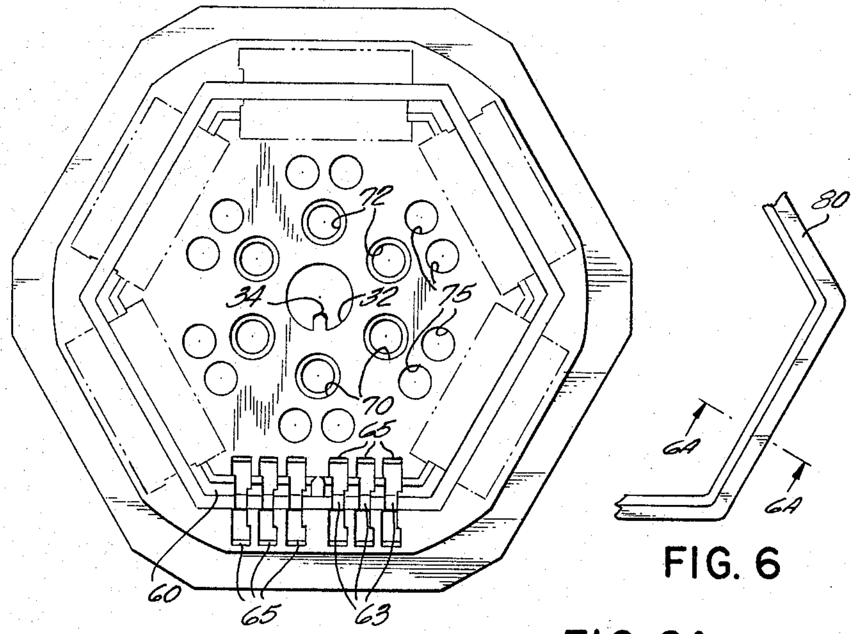
FIGURE 5 is a partly schematic top plan view of the connector device of FIGURE 4.
FIGURES 6 and 6A are partial plan and section views, respectively, of a retaining ring used in conjunction with the connector device of FIGURE 4.
Figure 6A:
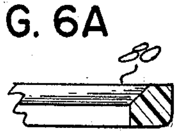

When all of contacts 64 have been properly positioned, a hexagonal ring 80 having the general shape and cross section illustrated in FIGURES 6 and 6A may be placed in seat 67 along the edges of slots 60 to form a transverse obstruction across each of slots 62 for locking the contacts within the cap. A hooked tab 69 may be formed on the end of contact 64 to engage ring 80 and provide added contact retention capability as well as to "preload" the contact by taking up any "slack" in its resiliency.

Socket contact receiving bores 70 in the connector housing caps 20 and 22 are axially aligned with the pin contacts 46 of the power stack assembly 40 when both the assembly and cap are assembled to the same keyed end piece on spindle 10. This assures that the pins will properly enter the receiving bores 70 to engage the mating contacts (not shown) disposed therein. The bores 70 may be provided with sections of reduced inner diameter 72 for engaging detent means (not shown) on the pin receiving socket contacts such as are shown, for example, in patent application Serial No. 14,310, now Patent No.

Figure 7:
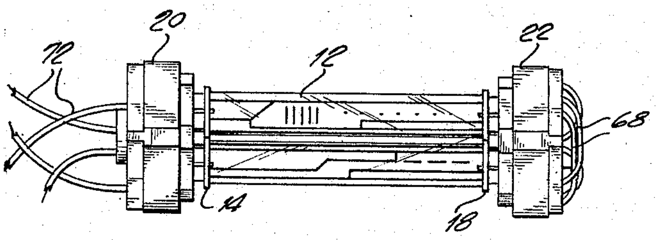
FIGURE 7 is a side view of completely assembled module.

3,031,638, assigned to the assignee of this application. These socket contacts may also be provided with any conventional means for mechanically and electrically engaging external wire conductors (e.g. wires 72 in FIGURE 7) so as to complete electrical circuits from the inserted pin contacts to the external wires.

While one of housing caps 20 and 22 is used for interconnecting the module assembly of the invention with external circuitry, the other may be utilized as a "programming" means for selectively interconnecting individual conductors within the module. This may be accomplished by providing the cap with a plurality of circuit board contacts 64, and a plurality of pairs of "read out" contacts 66 connected to the opposite ends of short lengths of "program wires" 68; interconnection of two conductors on two separate boards then simply requires inserting each of the contacts 66 on a "program wire" into engagement with the appropriate two contacts 64.

In use, one of the receptacle caps, preferably cap 20 associated with power wafer subassembly 40, may be securely mounted to a bulkhead or other relatively fixed support. The remainder of the module skeleton including the "programming cap" 22 and power distribution subassembly 40, may then be readily inserted into or removed from the circuit to which cap 20 is connected, as an integral whole. To enhance usage in this manner, spindle end piece 28 may be provided with a threaded tip 29 to receiving a nut (not shown) and/or threaded handle (not shown) to secure cap 22 to the spindle and simplify separation of the assembly skeleton from cap 20.

Each of the axially assembled elements of the assembly, such as caps 20 and 22, and wafers 14, 16, 18, etc., may be provided as shown with a plurality of axially unobstructed vent holes 90 and 91 respectively to improve air flow through the chimney-like assembly. Considerable dissipation of undesired heat generated by the electrical components within the assembly may thus be achieved.

This invention may now be seen to comprise a new and unusual module construction in which the circuit boards and connector devices serve as integral structural members of the module. This module construction may in a basic version comprise simply a plurality of boards disposed as described between at least one connector cap and one support means. In the disclosed embodiment, it may now be seen that the central spindle or skeleton structure aligns, positions and supports the boards in a simple, effective, and easily assembled or disassembled manner which permits ready inspection, maintenance and replacement. Electrical connections to the boards are achieved in a direct plug-in operation which further facilitates operational handling while providing, with a minimum of parts, a structurally sound and relatively rigid assembly having good resistance to vibration and handling forces.

The invention has thus been described but it is desired to be understood that it is not confined to the particular forms or usages shown and described, the same being merely illustrative, and that the invention may be carried out in other ways without departing from the spirit of the invention; therefore, the right is broadly claimed to employ all equivalent instrumentalities coming within the scope of the appendent claims, and by means of which objects of this invention are attained and new results accomplished, as it is obvious that the particular embodiments herein shown and described are only some of the many that can be employed to obtain these objects and accomplish these results.

We claim:

1. A connector assembly for electrical circuits, comprising: a plurality of printed circuit boards disposed about a central axis in nonparallel planes substantially corresponding to the side walls of a polyhedron, said boards having conductive surface portions thereon; connector means at one end of said axis including, a housing member having a plurality of circuit board receiving slots each having an end of one of said boards inserted therein, and a plurality of electrical contact members disposed within each slot engaging the conductive surfaces on the inserted boards; a housing member positioned at the other end of said axis, including a plurality of slots each having another end of one of said boards inserted therein, said boards being positioned in their respective nonparallel planes; and means for interconnecting the two side housing members, including a central spindle member extending therebetween engaging one housing member at one end thereof and the other housing member at the other end thereof.

2. The connector assembly of claim 1 wherein both housing members include a plurality of contact members disposed in said slots for engaging conductive surfaces on the inserted boards.

3. The connector assembly of claim 1, further including means for maintaining said printed circuit boards in their respective nonparallel planes independently of at least one of said housing members, said means including said axially extending central spindle member; and radially extending support means on said spindle spaced from said other housing member for engaging said boards in substantially fixed relation.

4. The connector assembly of claim 1 further including means for maintaining said printed circuit boards in their respective nonparallel planes independently of at least one of said housing members, said means including said axially extending central spindle member having axially spaced apart first and second radially extending means thereon adapted to engage said boards in substantially fixed relation.

5. The connector assembly of claim 4 wherein said housing members and said radially extending support means include openings therein for permitting air flow within said assembly substantially parallel to said central axis.

6. A connector assembly for electrical circuits, comprising: a plurality of printed circuit boards disposed about a central axis in nonparallel planes substantially corresponding to the side faces of a polyhedron, said boards having conductive surface portions thereon; circuit board support means, including an axially disposed central spindle member, engaging and supporting each of said boards in said nonparallel planes; connector means, including a housing member having a plurality of circuit board receiving slots each having an end portion of one of said boards inserted therein, and a plurality of circuit board contact members disposed within each slot in electrical engagement with conductive surfaces on said boards; and, power distribution means substantially co axial to said spindle member, including a plurality of peripherally disposed interconnected contact elements engaging conductive surfaces on selected ones of said circuit boards.

7. The connector assembly of claim 6 wherein said power distribution means and said housing member include mating electrical contact means for connecting the contact elements of said distribution means to external conductors coupled to said mating contact means.

8. The connector assembly of claim 7 wherein said mating contact means comprises a plurality of plug members and a plurality of socket members positioned to be axially mated upon axial relative motion of said distribution means and said housing.

9. The connector assembly of claim 8 wherein one of said plugs and a corresponding one of said sockets are adapted to mate prior to the others, as the distribution means and the housing member are axially moved together, for effecting a preliminary circuit connection.

10. The connector assembly of claim 6 wherein said power distribution means comprises: a plurality of conductive contact wafers each having a plurality of peripherally disposed contacts adapted to engage conductive surfaces on said printed circuit boards, and a plurality of dielectric wafers disposed intermediate adjacent contact wafers to form a laminate structure having successive conductive wafers electrically isolated from one another.

11. The connector assembly of claim 10 wherein each of said conductive contact wafers further includes an electrical contact member attached thereto and adapted to engage a corresponding mating contact on said housing member to establish electrical connections between said contact wafers and external conductors coupled to said housing.

12. A connector for a plurality of printed circuit boards, comprising: a first housing member having a plurality of printed circuit board receiving slots disposed in nonparallel planes about a central axis; a plurality of contact members positioned within said slots to engage the conductors of printed circuit boards inserted therein; a second housing member axially spaced from said first housing member along said central axis and having a plurality of printed circuit board receiving slots disposed about said central axis in substantial alignment with the corresponding slots in said first housing member; a central spindle member disposed along said central axis and having said first housing member coupled to one end thereof and said second housing member coupled to the other end thereof; means on said central spindle member for supporting said printed circuit boards in substantially fixed relation thereto in planes defined by corresponding slots on said first and second housing members, said supporting means including releasable interlocking means for separately engaging each circuit board; power distribution means coupled to and substantially coaxial with said central spindle member, said means including a plurality of peripherally disposed interconnected contacts for engaging conductors on selected ones of the printed circuit boards engaged by said supporting means; and, connection means associated with said power distribution means for connecting an external source of electrical potential thereto.

References Cited by the Examiner

UNITED STATES PATENTS 2,958,013 10/1960 Ansley ------------ 317—101

ROBERT K. SCHAEFER, *Primary Examiner.*

JOHN F. BURNS, KATHLEEN H. CLAFFY, *Examiners.*

J. J. BOSCO, *Assistant Examiner.*